United States Patent [19]

Kondo et al.

[11] Patent Number: 5,285,104
[45] Date of Patent: Feb. 8, 1994

[54] ENCAPSULATED SEMICONDUCTOR DEVICE WITH BRIDGE SEALED LEAD FRAME

[75] Inventors: Mitsuhiro Kondo; Osamu Watanabe, both of Oogaki, Japan

[73] Assignee: Ibiden Co., Ltd., Oogaki, Japan

[21] Appl. No.: 953,048

[22] Filed: Sep. 29, 1992

[30] Foreign Application Priority Data

Oct. 2, 1991 [JP] Japan ................... 3-255516

[51] Int. Cl.⁵ .............. H01L 23/48; H01L 29/44; H01L 29/52; H01L 29/60
[52] U.S. Cl. .................... 257/666; 257/667; 257/670
[58] Field of Search ............... 257/666, 667, 670, 671, 257/676

[56] References Cited

U.S. PATENT DOCUMENTS 4,942,455  7/1990  Shinohara ................. 257/666
5,031,022  7/1991  Yamamoto et al. ......... 257/667

Primary Examiner—Sheila V. Clark
Attorney, Agent, or Firm—Sughrue, Mion, Zinn, Macpeak and Seas

[57] ABSTRACT

A lead frame and a circuit board for mounting thereon a semiconductor element for encapsulating a semiconductor device by transfer molding comprising an electrically conductive lead portions connected to the frame portion and a bridge member connecting the lead portions together. Each lead portion is partially encapsulated by a mold resin and divided into inner and outer lead portions by the resin boundary. The electrically insulating and heat-resisting bridge member is disposed at a position corresponding to the outer surface of the mold resin and having a thickness at least equal to that of the lead portions. Therefore, the spaces between the lead portions are completely closed by the bridge member, so that no burr is formed between the leads and leads are mechanically supported while being electrically insulated from each other, whereby a fine pitch lead frame can easily realized. A semiconductor device in which the lead frame or the circuit board is used is also disclosed.

16 Claims, 11 Drawing Sheets

ENCAPSULATED SEMICONDUCTOR DEVICE WITH BRIDGE SEALED LEAD FRAME

BACKGROUND OF THE INVENTION

This invention relates to a lead frame, a circuit board for mounting a semiconductor integrated circuit and a semiconductor device as well as their manufacturing methods and, more particularly, to a lead frame, a circuit board for mounting a semiconductor integrated circuit and a semiconductor device as well as their manufacturing methods for use in encapsulating a semiconductor integrated circuit within a mold resin by transfer molding using a mold die which defines a mold cavity when sandwiching the leads therebetween.

A lead frame for use in molding semiconductor elements such as an integrated circuit by a mold resin through the use of a mold die is well known. Such lead frame is formed by cutting an electrically conductive metal sheet to have an electrically conductive frame portion having an opening, an electrically conductive island portion supported by support pins within the frame opening for mounting a semiconductor element thereon and a plurality of lead portions extending from the frame portion toward the island portion. The lead portions are a plurality of electrically conductive lead members spaced apart from each other to define spaces therebetween and having an inner end extending from the frame portion toward the island portion and spaced apart from the island portion, and each lead portion includes an inner lead portion to be encapsulated by the mold resin, an outer lead portion to project outwardly from an outer surface of the mold resin, and a boundary defined between the inner lead portion and the outer lead portion. The lead frame also comprises a tie bar extending between the lead portions for integrally connecting the lead portions together, thereby maintaining a proper position of the lead portions of the frame so that the lead portions are not broken or bent. The tie bar also functions to provide a dam-like barrier for preventing the mold resin from flowing into spaces formed between the lead portions sandwiched between the mold die when the mold die is applied to the lead frame so that the mold resin does not leak from the mold cavity of the mold die upon transfer molding, wherefore the tie bar is also referred to as a dam-bar.

After transfer molding the semiconductor element with the mold resin, the tie-bar must be removed from the lead portions by a suitable punching die so that the respective lead portions are electrically independent from each other. However, since the fineness of the patterns that can be punched out by the punching die is limited, it has not been possible to manufacture a package employing a lead frame having fine pitch leads having a lead pitch of from 0.3 mm to 0.5 mm for example.

Also, since the conductive tie-bar must be completely removed from the package after it is completed, the tie-bar is disposed spaced apart from and outside of the mold resin. Therefore, the mold resin material flows into the spaces between the leads and between the tie-bar and the mold resin side face, so that burrs are formed. While the burrs are formed in the spaces between the number of the leads, they are irregularly and unstably formed such that they appear in some of the spaces while they do not appear in other of the spaces, so that the completed semiconductor device is very much degraded in appearance and its commercial value is reduced. Therefore, the process of manufacturing a semiconductor device includes a step of removing burrs.

SUMMARY OF THE INVENTION

Accordingly, one object of the present invention is to provide a lead frame which supports leads in place during the manufacture of the semiconductor device and which prevents the mold resin from flowing out from the mold die during the transfer mold so that the need for removing the dam-bar after the transfer mold is not necessary.

Another object of the present invention is to provide a circuit board for mounting a semiconductor integrated circuit which supports leads in place during the manufacture of the semiconductor device and which prevents the mold resin from flowing out from the mold die during the transfer mold so that the need for removing the dam-bar after the transfer mold is not necessary.

A further object of the present invention is to provide a semiconductor device in which the leads are supported in place during the manufacture of the semiconductor device and the mold resin is prevented from flowing out from the mold die during the transfer mold so that the need for removing the dam-bar after the transfer-molding is not necessary.

A further object of the present invention is to provide a semiconductor device in which the leads are supported in place during the manufacture of the semiconductor device and the mold resin is prevented from flowing out from the mold die during the transfer mold so that the need for removing the dam-bar after the transfer-molding is not necessary.

According to the present invention, the lead frame for use in encapsulating a semiconductor integrated circuit within a mold resin formed by a mold die comprises an electrically conductive frame portion having an opening, an electrically conductive island portion disposed within the opening of the frame portion for mounting the semiconductor integrated circuit thereon, a support pin portion connected between the island portion and the frame portion for supporting the island portion in place relative to the frame portion, a plurality of electrically conductive lead portions each having an outer end connected to the frame portion and an inner end extending from the frame portion toward the island portion and spaced apart from the island portion, the lead portions being spaced apart from each other to define a space therebetween, and each of the lead portions including an inner lead portion for being sealed by the mold resin, an outer lead portion for being projecting from an outer surface of the mold resin and a boundary between the inner lead portion and the outer lead portion, and a bridge member made of an electrically insulating and heat-resisting resin material extending between the lead portions at a position corresponding to the outer surface of the mold resin and having a thickness at least equal to the thickness of the lead portion, the bridge member extends outwardly from the boundary by a predetermined distance along the outer lead portions, whereby the bridge member seals the space defined between the lead portions when the mold die is applied on the lead frame and reinforces the outer lead portions where the bridge member extends.

According to another aspect of the present invention, the lead frame for use in encapsulating a semiconductor integrated circuit within a mold resin formed by a mold die comprises an electrically conductive frame portion having an opening, a plurality of electrically conductive lead portions each having an outer end connected to the frame portion and an inner end inwardly extending from the frame portion, the lead portions being spaced apart from each other and defining an opening portion at an inner end face thereof, each of the lead portions including an inner lead portion for being sealed by the mold resin, an outer lead portion for being projecting from an outer surface of the mold resin and a boundary between the inner lead portion and the outer lead portion, and a bridge member made of an electrically insulating and heat-resisting resin material extending between the lead portions over an entire area inside a position corresponding to the outer surface of the mold resin and having a thickness at least equal to the thickness of the lead portion, the bridge member including a mounting portion for mounting the semiconductor integrated circuit thereon, whereby the bridge member seals the space defined between the lead portions when the mold die is applied on the lead frame.

According to the present invention, the circuit board for mounting a semiconductor integrated circuit within a mold resin formed by a mold die, comprises an electrically conductive frame portion having an opening, an electrically insulating substrate for mounting the semiconductor integrated circuit thereon, the substrate being disposed within the opening of the frame portion and having a circuit conductor for being electrically connected to the semiconductor integrated circuit, a plurality of electrically conductive lead portions each having an outer end connected to the frame portion and an inner end extending from the frame portion into the substrate and electrically connected to the circuit conductor, spaced apart from the island portion, and each of the lead portions including an inner lead portion for being sealed by the mold resin, an outer lead portion for being projecting from an outer surface of the mold resin and a boundary between the inner lead portion and the outer lead portion, and a bridge member made of an electrically insulating and heat-resisting resin material extending between the lead portions at a position corresponding to the outer surface of the mold resin and having a thickness equal to the thickness of the lead portion, the bridge member extends outwardly from the boundary by a predetermined distance along the outer lead portions, whereby the bridge member seals the space defined between the lead portions when the mold die is applied on the lead frame.

The semiconductor device of the present invention comprises an electrically conductive island for mounting a semiconductor integrated circuit thereon, a semiconductor integrated circuit mounted thereon, a plurality of electrically conductive leads each having an inner end spaced apart from the island and outwardly extending, the leads being spaced apart from each other to define spaces therebetween, electrically conductive wires electrically connecting the semiconductor integrated circuit to the inner ends of the leads, a mold resin for sealing the island, the semiconductor integrated circuit, the leads and the conductive wires, the mold resin dividing each of the leads into an inner lead portion sealed within the mold resin and an outer lead portion outwardly projecting from an outer surface of the mold resin and defining a boundary therebetween, and a bridge member made of an electrically insulating and heat-resisting resin material extending between the leads at a position corresponding to the outer surface of the mold resin and having a thickness at least equal to the thickness of the leads, the bridge member extends outwardly from the boundary by a predetermined distance along the outer leads, thereby to reinforce the outer leads.

The semiconductor device of the present invention may alternatively comprise a semiconductor integrated circuit, a plurality of electrically conductive leads each having an inner end adjacent to the semiconductor integrated circuit and extending outwardly, the leads being spaced apart from each other to define spaces therebetween, electrically conductive wires electrically connecting the semiconductor integrated circuit to the inner ends of the leads, a mold resin for sealing semiconductor integrated circuit, the leads and the conductive wires, the mold resin dividing each of the leads into an inner lead portion sealed within the mold resin and an outer lead portion outwardly projecting from an outer surface of the mold resin and defining a boundary therebetween, and an electrically insulating bridge member extending between the leads at a position corresponding to the outer surface of the mold resin and having a thickness at least equal to the thickness of the leads.

According to the present invention, the method for manufacturing a lead frame comprises the steps of preparing a frame sheet including an electrically conductive frame portion having an opening, an electrically conductive island portion disposed within the opening of the frame portion for mounting the semiconductor integrated circuit thereon, a support pin portion connected between the island portion and the frame portion for supporting the island portion in place relative to the frame portion and a plurality of electrically conductive lead portions each having an outer end connected to the frame portion and an inner end extending from the frame portion toward the island portion and spaced apart from the island portion, the lead portions being spaced apart from each other to define a space therebetween, and each of the lead portions including an inner lead portion for being sealed by the mold resin, an outer lead portion for being projecting from an outer surface of the mold resin and a boundary between the inner lead portion and the outer lead portion, applying a first mask material layer on the lead portions except for an area at a position corresponding to the outer surface of the mold resin and crossing the boundary, heating and pressing the first mask material to cause the material to flow into and fill the space between the lead portions except for the area crossing the boundary, filling an electrically insulating and heat-resisting resin into the area crossing the boundary between the lead portions and heating it for curing, and removing the first mask material, thereby forming a bridge member made of an electrically insulating and heat-resisting resin material extending between the lead portions at an area crossing the boundary and having a thickness at least equal to the thickness of the lead portion.

The method for manufacturing a circuit board of the present invention comprises the steps of preparing a frame sheet including an electrically conductive frame portion having an opening, a plurality of electrically conductive lead portions each having an outer end connected to the frame portion and an inner end extending from the frame portion into the substrate and electrically connected to the circuit conductor, spaced apart from each other, and each of the lead portions including an inner lead portion for being sealed by the mold resin, an outer lead portion for being projecting from an outer surface of the mold resin and a boundary between the inner lead portion and the outer lead portion, applying a first mask material layer on the lead portions at least on an area outside of a boundary position corresponding to the outer surface of the mold resin, heating and pressing the first mask material to cause the material to flow into and fill the space between the lead portions at the area outside of the boundary, applying a second mask material layer on the lead portions and the first mask material between the lead portions at an area outside of a position at which the substrate is to be formed, forming an electrically insulating resin substrate material layer on the frame sheet including the second mask material layer, forming an electrically conductive circuit which is electrically connected to the inner end of the lead portions on the substrate material layer, removing the substrate material layer on the outer lead portions of the lead portions together with the second mask material, and removing the first mask material, thereby forming a bridge member made of an electrically insulating and heat-resisting resin material which extends between the lead portions at the inner entire area including a position corresponding to the outer surface of the mold resin and which has a thickness at least equal to the thickness of the lead portion.

Also, according to the present invention, the method for manufacturing a semiconductor device comprises the steps of preparing a lead frame or semiconductor integrated circuit mounting circuit board as previously described, mounting a semiconductor integrated circuit on the island portion, electrically connecting the semiconductor integrated circuit to the inner ends of the lead portions through electrically conductive wires, applying the mold die having a mold cavity to sandwich the lead portions therebetween so that the mold cavity is sealed by the bridge member between the lead portions, and that the mold cavity accommodates the island portion, the semiconductor integrated circuit, the outer lead portions of the lead portions, the conductive wires and at least one portion of the bridge member, sealing by transfer molding the semiconductor integrated circuit with a mold resin and separating the frame portion from the lead portions.

According to the lead frame of the present invention, a bridge member made of an electrically insulating and heat-resisting resin material which extends between the lead portions at a position corresponding to the outer surface of the mold resin and has a thickness at least equal to the thickness of the lead portion, so that the space defined between the lead portions is sealed when the mold die is applied on the lead frame and no mold rein material leaks from the mold cavity of the mold die. Also, since the bridge member is electrically insulating, there is no need to remove the bridge member by the punching die or the like after the semiconductor integrated circuit is transfer-molded within the mold resin, thus enabling a lead frame of the fine pitch lead type having a lead pitch of from 0.3 mm to 0.5 mm. Also, since burrs of the mold resin material cannot be formed between the leads, the burr removing process can be omitted from the semiconductor device manufacturing process.

Thus, according to the present invention, the leads are supported in place during the manufacture of the semiconductor device and the mold resin is prevented from flowing out from the mold die during the transfer mold so that the need for removing the dam-bar after the transfer-molding is not necessary.

BRIEF DESCRIPTION OF THE DRAWINGS

The present invention will become more readily apparent from the following detailed description of the preferred embodiment of the present invention, in which.

DESCRIPTION OF THE PREFERRED EMBODIMENTS

Figure 1:
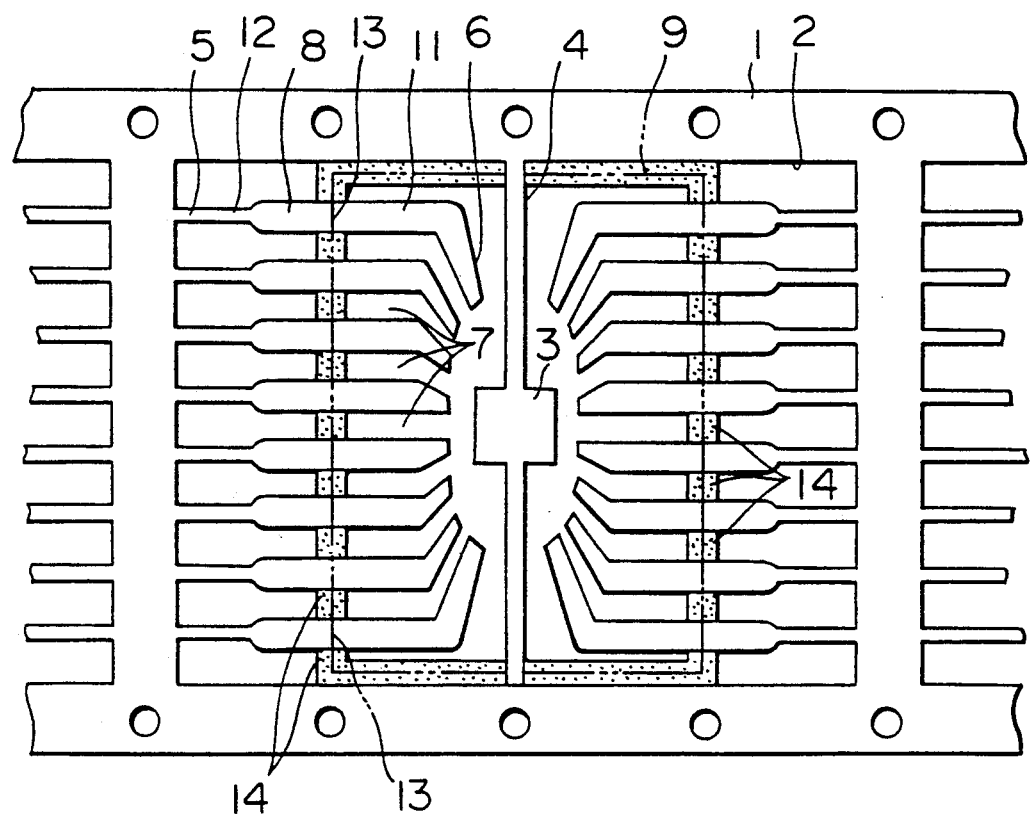
FIG. 1 is a plan view of a lead frame for dual in-line package (DIP) of the present invention.
Figure 2:
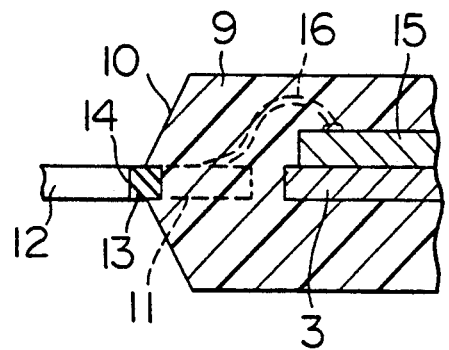
FIG. 2 is a sectional side view of a semiconductor device which utilizes the lead frame illustrated in FIG. 1.

FIG. 1 illustrates a lead frame of an embodiment of the present invention for DIP (Dual In-line Package) for mounting and sealing a semiconductor integrated circuit within a mold resin formed by utilizing a mold die. FIG. 2 illustrates in a sectional view a semiconductor device in which a semiconductor element is mounted on the lead frame shown in FIG. 1.

The lead frame is a member punched out from a tape-shaped electrically conductive sheet material made of a copper alloy or an iron alloy (42-alloy, Kovar) well-known as a lead frame material, the lead frame having formed therein a series of substantially square frame portions 1 and the frame portions 1 having formed therein an opening 2 having a substantially square general contour. At the center of the opening 2, an electrically conductive island portion 3 for mounting a semiconductor integrated circuit (see FIG. 2) thereon is provided, and support pin portions 4 for supporting the island portion 3 in place relative to the frame portion 1 are disposed between the island portion 3 and the frame portion 1.

The lead frame further comprises a plurality of electrically conductive lead portions 8 each having an outer end integrally connected to the frame portion 1 and an inner end 6 extending from the frame portion 1 toward the island portion 3 but spaced apart from the island portion 3, and the lead portions 8 being spaced apart from each other to define spaces 7 therebetween. Each of the lead portions 8 includes an inner lead portion 11 which is located inside of an outer side surface 10 of a mold resin 9 (see FIG. 2) after transfer molding and sealed by the mold resin 9, an outer lead portion 12 which projects from the outer surface 10 of the mold resin 9 and a boundary 13 between the inner lead portion 11 and the outer lead portion 12.

The lead frame of the present invention further comprises a bridge member 14 secured between the lead portions 8 to extend therebetween at a position corresponding to the outer surface 10 of the mold resin 9, or a position of the boundary 13, and having a thickness at least equal to the thickness of the lead portions 8. The bridge member 14 functions to mutually connect the lead portions 8 for maintaining their positions and, when the mold die (not shown) is applied on the lead frame, to seal the spaces 7 defined between the lead portions 8 and prevent the resin injected into the mold cavity of the mold die from leaking outward through the spaces 7.

The bridge member 14 is made of a resin which is electrically insulating and heat-resisting resin material having a strength sufficient to withstand the filling pressure of the resin mold. Some examples of such resin material are bismaleimide triazine resin, polyimide resin, epoxy resin, tetrafluoethylene and their mixtures with inorganic filler material. The same epoxy resin as that used for transfer molding may equally be used. Further, when the bridge member 14 is used in a circuit board for mounting a semiconductor integrated circuit in which the lead frame is combined with an electrically insulating substrate which will be described later, the bridge member 14 may be identical to that of the insulating substrate.

The illustrated bridge member 14 has a width dimension sufficient to extend across the boundary 13, or in other words, the bridge member 14 extends by a small distance on each side of the boundary 13. The width dimension may be between 0.2 mm and 0.5 mm. The bridge member 14 has a thickness equal to the lead portions 8 in the illustrated example, so that the conventional mold die for use with the lead frames having the conventional metallic tie-bar can be used without the need for any modification.

Since the bridge member 14 is also disposed on the side without the lead portions 8 or on the horizontally extending portions along the frame portion 1 in the upper and lower portions of the figure, no burrs are formed on these portions but the bridge member 14 in the form of a flange projects from the side surfaces of the mold resin 9. However, if it is desired, this flange-like portion of the bridge member 14 can be easily removed by punching together with the support pins 4.

Figure 3:
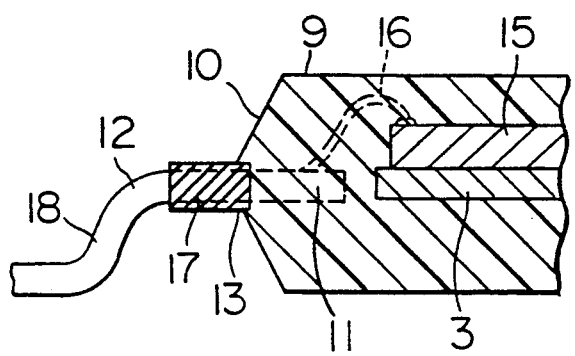
FIG. 3 is a sectional side view of a semiconductor device of another embodiment of the present invention.
Figure 4:
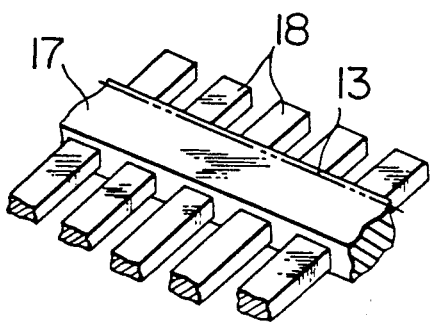
FIG. 4 is a perspective view illustrating the bridge member of the semiconductor device illustrated in FIG. 3.

FIG. 2 illustrates a semiconductor in which a semiconductor integrated circuit 15 is secured on the island portion 3 of the lead frame shown in FIG. 1, the semiconductor integrated circuit 15 is connected to the inner lead portions 11 through bonding wires 16 and in which these components are encapsulated within the mold resin 9. FIGS. 3 and 4 illustrate an example of a semiconductor device in which the bridge member 17 is thicker than the leads 18 by an amount between about 0.005 mm and about 0.010 mm so that the upper and the lower surfaces of the bridge member 17 are respectively continuous and in which the leads 18 are extending through the bridge member 17. In this example, the thickness of the bridge member 17 must be taken into consideration in determining the height dimension of the cavity of the mold. The bridge member 17 is also extended outwardly beyond the boundary 13 along the outer leads 12 of the leads 18 by a relatively large predetermined distance, thereby reinforcing the outer leads 12 in those portions. In this case, the bridge member 17 has a width dimension of from 1 mm to 2 mm. In this embodiment, the leads 18 have a larger resistance to bending (deflection) and provide a good resistance to moisture because of a longer path for the moisture entering along the leads 18.

Figure 5:
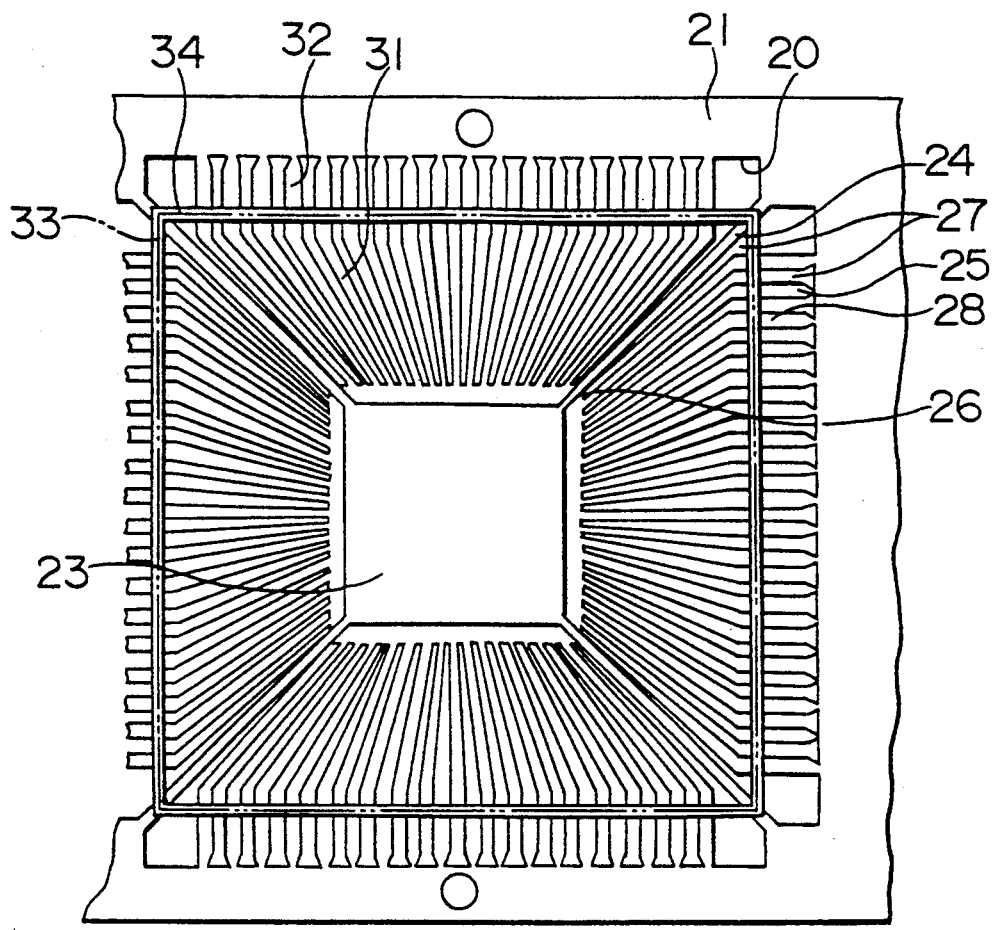
FIG. 5 is a plan view of a lead frame for quad flat L-leaded package (QFP) of the present invention.
Figure 6:
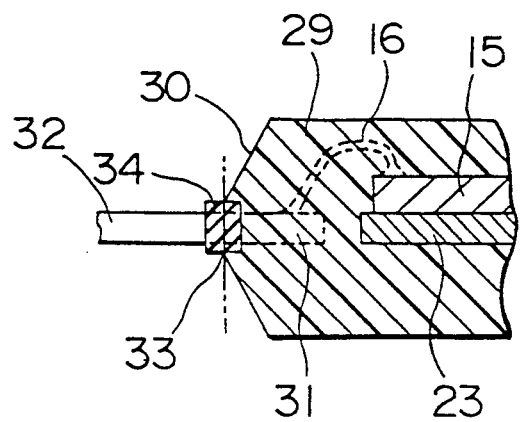
FIG. 6 is a sectional side view of the semiconductor device employing the lead frame illustrated in FIG. 5.

FIGS. 5 and 6 are a plan view of a frame sheet having a plurality of lead frames which is an example of the present invention applied to a lead frame of QFP (Quad Flat L-Leaded Package) and a sectional view of the semiconductor device manufactured with this lead frame. The main difference between the lead frame of FIG. 5 and the lead frame of FIG. 1 is that, in the lead frame shown in FIG. 5, the lead portions are disposed along all of the four sides of the substantially square island portion and the bridge member connecting the lead portions is disposed on the lead portions along all the sides of the square island portion.

That is, the lead frame comprises an electrically conductive frame portion 21 having an opening 22, an electrically conductive island portion 23 for mounting a semiconductor integrated circuit (FIG. 6) thereon, support pin portions 24 for supporting the island portion 23 in place relative to the frame portion 21 and lead portions 28 each having an outer end 25 connected to the frame portion 21 and an inner end 26 extending from the frame portion 21 toward the island portion 23 and spaced apart from the island portion 23, the lead portions 28 being spaced apart from each other to define spaces therebetween. Each of the lead portions 28 includes an inner lead portion 31 to be encapsulated by a mold resin 29 (FIG. 6) and an outer lead portion 32 to be projected from an outer surface 30 of the mold resin 29, and the inner lead portion 31 and the outer lead portion 32 are divided by a boundary 33. The bridge member 34 which extends on the lead portions 28 to surround the island portion 23 is disposed at the position corresponding to the outer surface 30 on the lead portions 28 or the position across the boundary 33. The bridge member 34 has a thickness greater than that of the lead portion 28 by an amount from 0.010 mm to 0.005 mm. The bridge member 34 may of course be abraded to provide a thickness equal to that of the lead portion 28.

Figure 7:
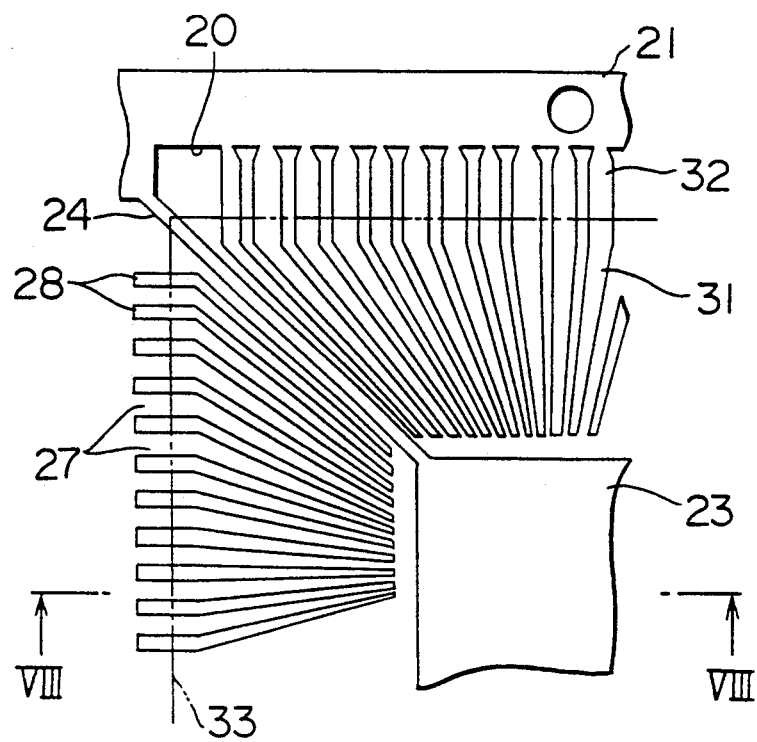
FIG. 7 is a fragmental plan view of the frame sheet for use in manufacturing the QFP lead frame illustrated in FIG. 5.
Figure 8:
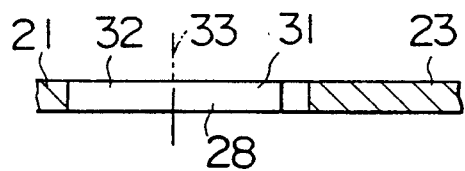
FIG. 8 is a sectional view of the lead frame taken along line VIII—VIII of FIG. 7.

FIGS. 7 to 12 schematically illustrate, as examples, a method for manufacturing the QFP lead frame shown in FIG. 5 and a method for manufacturing the semiconductor device shown in FIG. 6. First, as shown in FIGS. 7 and 8, a frame sheet having formed therein a plurality of lead frames 22 is prepared by any well known method such as punching or the like. The lead frame 22 has a structure different from the lead frame illustrate in FIG. 5 in that no bridge member 34 is provided, but the structure is identical in other respects. That is, the lead frame 22 comprises an electrically conductive frame portion 21 having the opening 20, an electrically conductive island portion 23, the support pin portions 24 and the plurality of electrically conductive lead portions 28 connected to the frame portion 21 and spaced apart from each other and having spaces 27 therebetween. The lead portion 28 has an inner lead portion 31 to be encapsulated by a mold resin 29 (FIG. 6) and an outer lead portion 32 to be projected from an outer surface 30 of the mold resin 29, and the inner lead portion 31 and the outer lead portion 32 are divided by a boundary 33.

Figure 9:
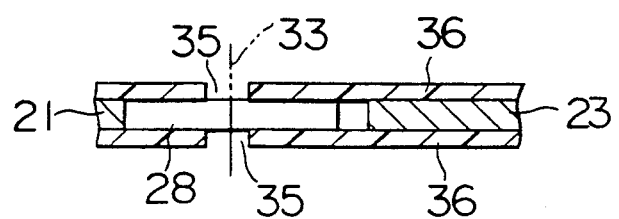
FIG. 9 is a sectional view illustrating the steps for applying the first mask material layer on the lead frame.

Then, as shown in FIG. 9, a first mask material layer 36 is applied over the entire lead frame on the lead portions 28 except for a region 35 at a position corresponding to the outer surface 30 of the mold resin 29 and crossing the boundary 33. The first mask material layer 36 is made of a resin easily melted with a solvent or a chemical (acid, alkaline) and has a thermo-plastic property allowing the resin to enter between the lead portions 28. Examples of such materials are polycarbonate, polysulfone, polyphenyleneoxide. These resin materials dissolve easily with a chloride system solvent such as methylene chloride. The first mask material layer 36 is formed by placing a film of the above resin material and having a thickness of from 0.03 mm to 0.05 mm on a predetermined position.

Figure 10:
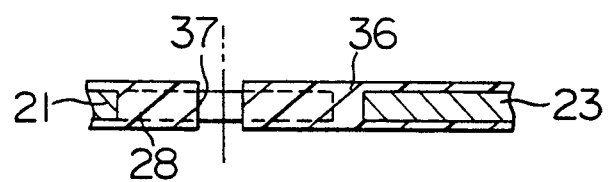
FIG. 10 is a sectional view illustrating the state in which the first mask material layer is thermocompression bonded.

Then, the first mask material layer 36 is subjected to a pressure from both sides while being heated, so that the material flows into and fills the spaces 27 (FIG. 7) between the lead portions 28 expect for the region 35 across the boundary 33 of the lead portions 28 to provide a state as shown in FIG. 10, which defines gaps 37 in the region 35 by setting the filled resin material. Although the material of the first mask material layer 36 slightly laterally overflows within the region 35 and the gap 37 is slightly smaller than the region 35, the gap 37 is sufficiently large for the purpose which will become apparent later. In this state, the thickness of the first mask material layer 36 on the lead portions 28 is from 0.010 mm to 0.005 mm and the width of the gap 37 is 0.050 mm.

Figure 11:
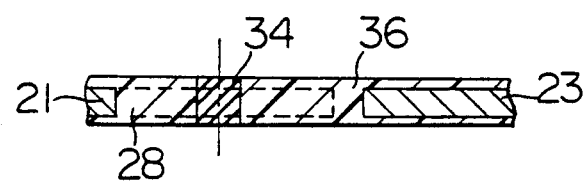
FIG. 11 is a sectional view illustrating the state in which the thermo-setting resin is filled.

FIG. 11 illustrates a process in which the bridge member 34 or the electrically insulating and heat-resisting resin material is filled into and thermo-set in the gap 37 formed across the boundary 33 between the lead portions 28 on the first mask material layer 36 formed as above described. This process includes the filling of the thermo-setting resin by the screen printing within the gap 37 and thermo-setting by an oven.

Figure 12:
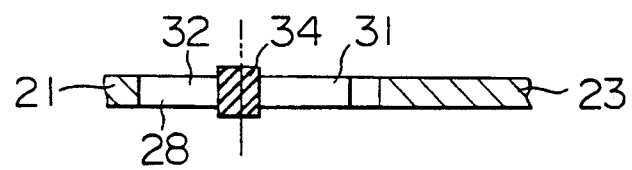
FIG. 12 is a sectional view of the finished lead frame with the first mask material layer removed.

Then, by removing the first mask material layer 36 with the above-discussed solvent, the bridge member 34 is formed between the lead portions 28 in the region 35 across the boundary 33 as illustrated in FIG. 12, whereby the lead frame 21 (see also FIG. 4) is completed. The thickness of the bridge member 34 is greater than that of the lead portions 28 by the thickness of the first mask material layer 36 (0.010 mm –0.005 mm, for example). At this time, the bridge member 34 may be polished to make the thickness equal to that of the lead portions 28.

Figure 13:
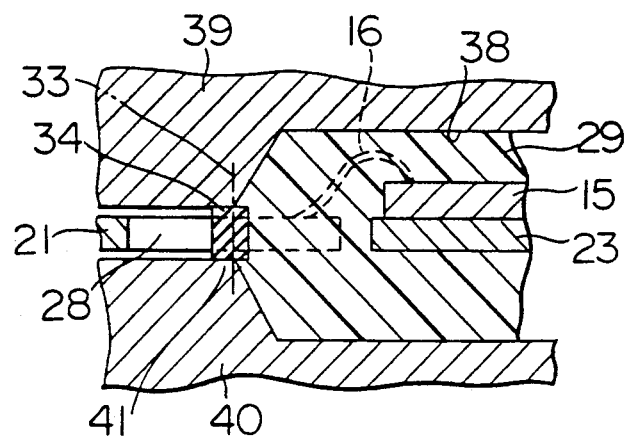
FIG. 13 is a sectional view of the semiconductor device in which the semiconductor integrated circuit is mounted on the lead frame illustrated in FIG. 12 and transfer-molded.

FIG. 13 illustrates the state in which the lead frame of the present invention manufactured as above described is placed between mold dies 39 and 40 having a mold cavity 38 and transfer-molded. As apparent from FIG. 13, the portions of the upper and the lower mold dies 39 and 40 that are brought into contact with the bridge member 34, which are corner portions 41 corresponding to the inner lead portion 31 and the outer lead portions 32, are in a continuous intimate contact with the bridge member 34 to extend along the bridge member 34 to surround the mold cavity 38, so that there is no gap even between the lead portions 28 through which the transfer mold resin leaks. On the island portion 23, a semiconductor element or the semiconductor integrated circuit 15 is secured and electrically connected to the lead portions 28 through the electrically conductive wires 16. The mold cavity 38 formed by the mold dies 39 and 40 is filled with the mold resin 29 to hermetically seal portions of the semiconductor element 15, the lead portions 28, the conductive wires 16 and the bridge member 34 within the mold resin 29, whereby the semiconductor device is completed within the mold dies 39 and 40.

FIGS. 14 to 21 illustrate a lead frame in which the bridge member continuously extends outwardly from the outer periphery of the island portion to a position on the lead portions beyond the boundary, and a semiconductor device and their manufacturing method.

Figure 14:
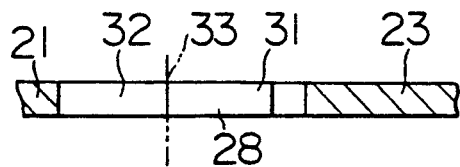
FIG. 14 is a sectional side view of the lead frame illustrating another manufacturing process of the present invention.
Figure 15:
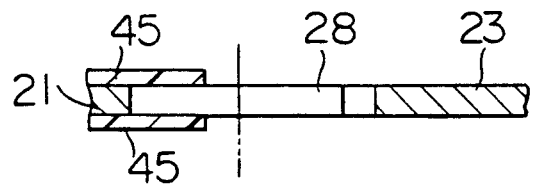
FIG. 15 is a sectional view illustrating the step of applying the first mask material layer.
Figure 16:
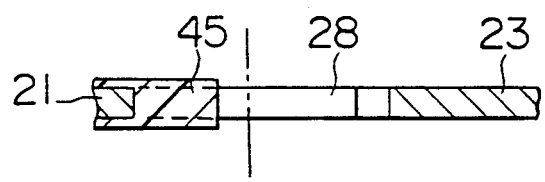
FIG. 16 is a sectional view illustrating the state in which the first mask material layer is thermocompressed.

First, as shown in FIG. 14, a lead frame sheet similar to that shown in FIGS. 7 and 8 is prepared, and a first mask material layer 45 of the same material as that of the first mask material layer 36 used in the embodiment shown in FIG. 9 is formed by the similar method as illustrated in FIGS. 15 and 16. This embodiment is different from the previous embodiment shown in FIG. 9 in that the first mask material layer 45 is disposed only in the portion further outside of the slightly outside position of the boundary 33 of the lead portions 28 but not in the entire area except for the relatively narrow region 35 on FIG. 9.

Figure 17:
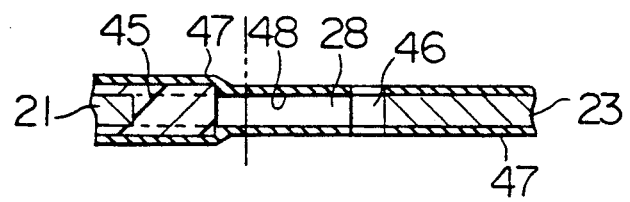
FIG. 17 is a sectional view illustrating the state in which the second mask is applied.

Then, as shown in FIG. 17, the entire upper and bottom surfaces of the first mask material layer 45, the lead portions 28 and the island portion 23 including the spaces 27 (see FIG. 7) between the lead portions 28, except for the space 46 extending along the outer periphery of the island portion 23 between the lead portions 28 and the inner lead portions 31, is coated with a second mask film 47. Therefore, a space 48 defined by a side surface of each inner lead portion 31 and the second mask film 47 is formed between the inner lead portions 31 of the lead portions 28. The second mask film 47 has a function of protecting the bonding pads from the resin upon transfer molding the thermo-setting resin to form the bridge member as well as of a separation mask for separating the first mask 45 and the bridge member. The materials for the second mask film 47 is polyparabanic acid, polyphenylenesulfone, tetrafluoroethylene or polyetyleneterephtalate.

Figure 18:
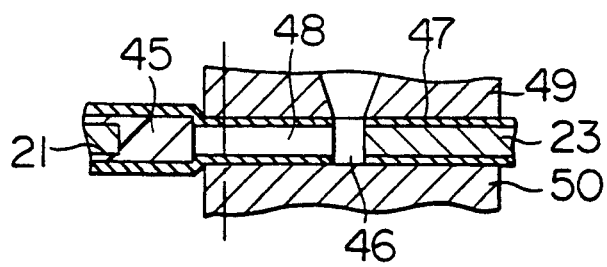
FIG. 18 is a sectional view illustrating the state in which the injection mold die is applied.
Figure 19:
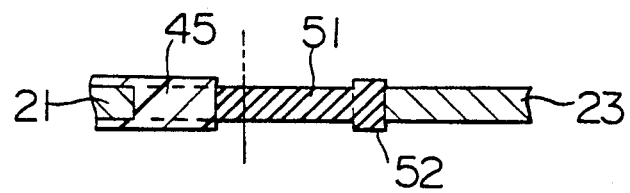
FIG. 19 is a sectional view illustrating the state in which the second mask is removed.
Figure 20:
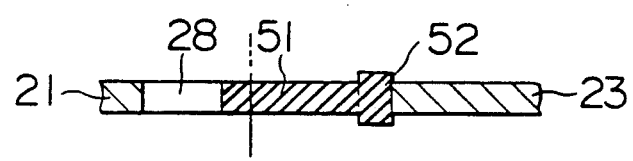
FIG. 20 is a sectional view of the finished lead frame with the first mask material layer removed.
Figure 21:
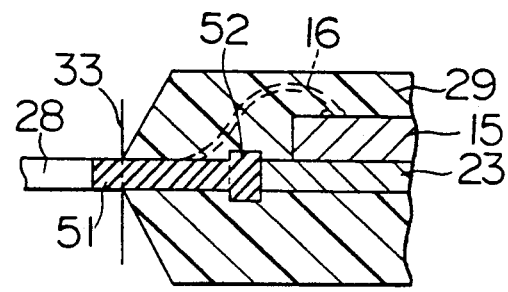
FIG. 21 is a sectional view of the semiconductor device in which a semiconductor integrated circuit is mounted and transfer-molded on the lead frame of FIG. 20.

As shown in FIG. 18, dies 49 and 50 for injection molding are applied and a thermo-setting resin is filled into the above described space 48 by the injection molding, heated to secure, and remove the injection mold dies 49 and 50 to remove the second mask film 47 to provide the state shown in FIG. 19. Then, by removing the first mask film 45, a wide bridge member 51 surrounding the island portion 23 and continuously extending from the position slightly outside of the boundary 33 of the lead portions 28 to the outer periphery of the island portion 23 is obtained. The thickness of the bridge member 51 is equal to that of the lead portions 28, but a raised portion 52 of a larger thickness by the thickness of the second mask film 47 is provided at the portion surrounding the island portion 23. This is the portion formed during the injection mold step shown in FIG. 18 corresponding to the portion where no second mask film 47 is provided. FIG. 21 illustrates a semiconductor device manufactured by using the lead frame manufactured as above described, wherein the semiconductor element 15 is mounted on the island portion 23 of the lead frame shown in FIG. 20 and connected to the leads 28 through the conductive wires 16, hermetically encapsulated within the mold resin 29, and wherein the frame portion 21 is cut removed from the leads 28.

According to this embodiment, in addition to the advantageous effects as previously described, the bending of the inner leads 31 can be prevented, the precision of the position of the wire bonding portions on the island portion 23 and the inner leads 31 can be maintained, and the reliability of the wire bonding operation is increased.

Figure 22:
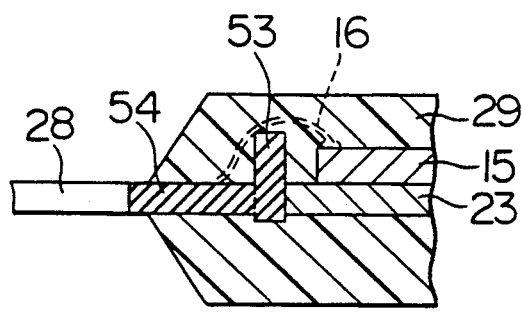
FIG. 22 is a sectional view of the semiconductor device having a bridge member including a raised portion.

In the semiconductor device shown in FIG. 22, the semiconductor element 15 is packaged by using a lead frame comprising a bridge member 54 having a raised portion 53 disposed along the outer periphery of the island portion 23. The raised portion 53 can be obtained by making the thickness of the second mask film 47 on the upper surface or the surface on which the semiconductor element 15 is to be mounted of the two second mask films 47 of the step shown in FIG. 17. The raised portion 53 may also be formed by modifying the upper die 49 of the mold dies of the step shown in FIG. 18 to have a mold cavity for the raised portion 53. The height of the raised portion 53 is 0.6 mm when the semiconductor element 15 having a thickness of 0.4 mm for example is to be mounted on the lead frame.

According to this embodiment, even when the bent portions of the bonding wires 16 is displaced from the predetermined position due to the flow of the mold resin 29 during the transfer molding, the displacement of the bonding wires 16 is limited by the raised portion 53 within a predetermined amount, so that the bonding wires 16 do not contact with each other and the yield and the reliability of the semiconductor device are increased.

Figure 23:
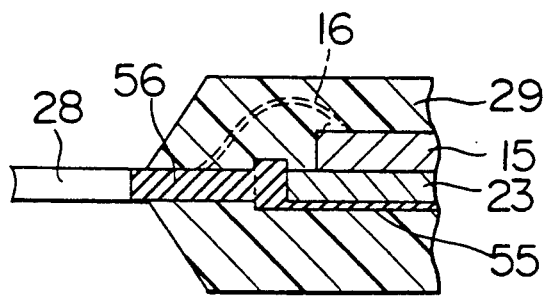
FIG. 23 is a sectional view of the semiconductor device having a back-up portion of the bridge member material under the island portion.

In the semiconductor device shown in FIG. 23, the semiconductor element 15 is packaged by using a lead frame comprising a bridge member 56 having a back-up portion 55 which extends over the entire bottom surface of the island portion 23. The back-up portion 55 under the island portion 23 can be formed by filing the resin which is the material of the bridge member 56 within a thin cavity formed under the island portion 23 by applying the injection mold dies 49 and 50 shown in FIG. 18 without providing the second mask film 47 on the bottom surface of the island portion 23. If necessary, the lower mold die 50 shown in FIG. 18 may be modified in its configuration to provide a mold cavity for forming the back-up portion 55. In order to strengthen the bondage between the back-up portion 55 and the island portion 23, it is desired to apply roughening treatment on the lower surface of the island portion 23. The roughening treatment is achieved by oxidation treatment when the lead frame is made of copper or a copper alloy and by oxidization of a copper-plated surface of the lead frame when it is made of 42-alloy, (trade name), Kovar (trade name) or stainless steel.

According to this embodiment, in addition to the advantageous effect of those of the previously embodiments, passivation cracks which run from the island portion 23 of the lead frame into the mold resin 29 can be prevented.

Figure 24:
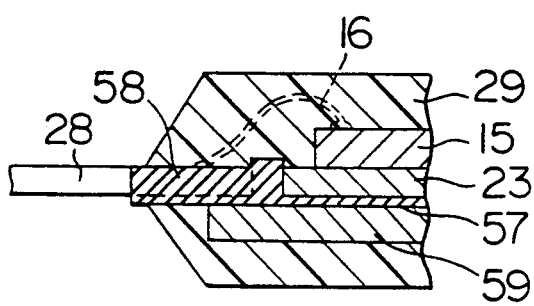
FIG. 24 is a sectional view of the semiconductor device including a heat dissipating plate.

In the semiconductor deice shown in FIG. 24, the semiconductor element 15 is packaged by using a lead frame comprising a bridge member 58 having formed a back-up portion 57 also extending over the entire bottom surface of the inner lead portions 31 of the lead portions 28 in addition to the island portion 23, and a heat-dissipating plate 59 is added to the bottom surface of the back-up portion 57. This back-up portion 57 may also be formed by a mold cavity formed by eliminating the second mask film 47. The heat-dissipating plate 59 is a metal plate such as of copper, aluminum or the like for dissipating to the exterior the heat generated by the semiconductor element 15 through the island portion 23, the back-up portion 57, the heat-dissipating plate 59, the back-up portion 57 under the leads 28 and the leads 28, so that the heat-dissipation of the semiconductor device is efficient.

Figure 25:
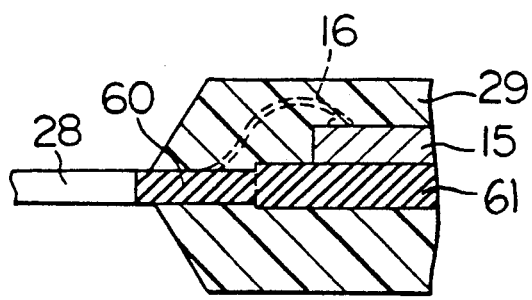
FIG. 25 is a sectional view of the semiconductor device including a bridge member having a mounting portion for the semiconductor integrated circuit.

The semiconductor device illustrated in FIG. 25 is the one using a lead frame having no island portion and which has a semiconductor element mounting portion 61 in a bridge member 60, and the lead frame is manufactured, similarly to the lead frame shown in FIG. 7, from a frame sheet having a plurality of electrically conductive lead portions spaced apart from each other and each having an inner end inwardly extending from the conductive frame portion but separated and defining an opening portion but having no island portion. That is, in the step shown in FIG. 18, the mold cavity of the mold dies 49 and 50 is modified so that mold dies that can form the semiconductor integrated circuit mounting portion 59 can be placed on the second mask material layer 47, filling and setting by injection molding an electrically insulating and heat resisting resin within the region inside of and including the boundary 33 between the lead portions 28, whereby the resin bridge member 60 having the mounting portion 59 on which the semiconductor integrated circuit 15 is mounted thereon. Then, the semiconductor integrated circuit 15 is mounted on the mounting portion 61 of the region bridge member 60 of the lead frame, the semiconductor integrated circuit 15 is electrically connected to the inner ends of the lead portions 28 through the conductive wires 16, applying the mold dies having the mold cavity with the lead portion therebetween so that the mold cavity is completely sealed by the bridge member between the lead portions, thereby to accommodate the semiconductor integrated circuit 15, the outer lead portions of the lead portions 28, the conductive wires 16 and the portion of the bridge member 60. By encapsulating the semiconductor integrated circuit within the mold resin by the transfer mold and separating the lead frame portion from the lead portions 28, the semiconductor device shown in FIG. 25 is obtained.

According to such semiconductor device, support pins 24 such as those shown in FIG. 7 for supporting the island portion 23 relative to the frame portion 21 since there is no island portion in the lead frame, dimensional margin or degree of freedom is generated in the design in the inner leads 31, further allowing the lead pitch to be made further finer.

Figure 26:
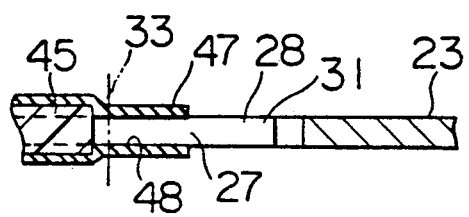
FIG. 26 is a sectional view corresponding to FIG. 17 illustrating the manufacturing step of the semiconductor integrated circuit mounting circuit board having the insulating substrate according to the present invention.

FIGS. 26 to 31 illustrate a circuit board for mounting a semiconductor integrated circuit of the present invention which comprises on the lead frame an electrically insulating resin substrate having a conductor circuit and semiconductor element mounting board, a semiconductor device using the circuit board and their manufacturing methods. In FIG. 26, in the manner similar to the step shown in FIGS. 14 to 17, the first mask film 45 is applied in the region outside of the position slightly outside of the boundary 33 of the lead portions 28, the first mask film 45 is filled between the lead portions 28 at this region by the thermocompression. Then, the first mask material layer 45 including the spaces 27 between the lead portions 28 and the region outside of the position on which the insulating substrate is to be formed and the position on the lead portions 28 is both sides completely covered with the second mask film 47. Therefore, between the inner lead portions 31 of the lead portions 28, spaces 48 defined between the side surfaces of each inner lead portions 31 and the second mask film 47 are formed.

Figure 27:
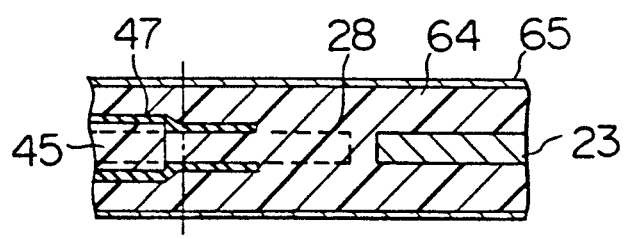
FIG. 27 is a sectional view illustrating the state in which the prepreg resin for the insulating substrate is applied.

In the step illustrated in FIG. 27, an electrically insulating prepreg resin substrate material layer 64 is pressed on the frame sheet including the second mask material layer 47 from the both sides of the frame sheet, so that the prepreg resin is entered into the spaces 27 between the lead portions 28. On the upper surface of the substrate material layer 64, an electrically conductive material layer 65 for a conductor circuit for connecting the semiconductor device is formed.

Figure 28:
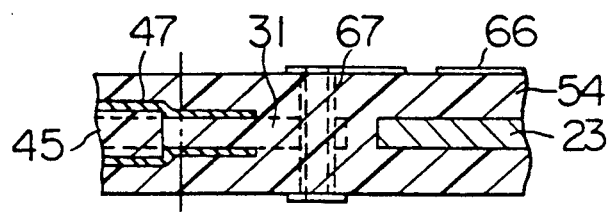
FIG. 28 is a sectional view illustrating the state in which a through hole is formed.

In FIG. 28, a conductive circuit pattern 66 is formed on the substrate material layer and one portion thereof is connected to the inner leads 31 through through holes 67.

Figure 29:
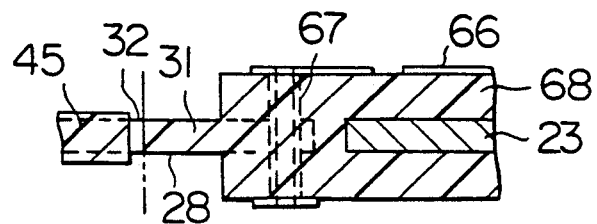
FIG. 29 is a sectional view illustrating the state in which one portion of the insulating substrate is removed.
Figure 30:
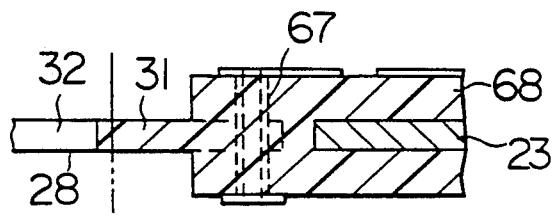
FIG. 30 is a sectional view illustrating the semiconductor integrated circuit mounting circuit board with the first mask removed.

Then, a groove is formed by the laser machining in the insulating substrate material layer 64 at the position of the outer edge of the insulating substrate 68 (which corresponds to the edge of the second mask film 47) and remove the portion outside of the position at which the insulating substrate 68 is to be formed together with the second mask film 47 from the lead frame, whereby the inner leads 31 and one portion of the outer leads 32 are exposed as illustrated in FIG. 29.

Figure 31:
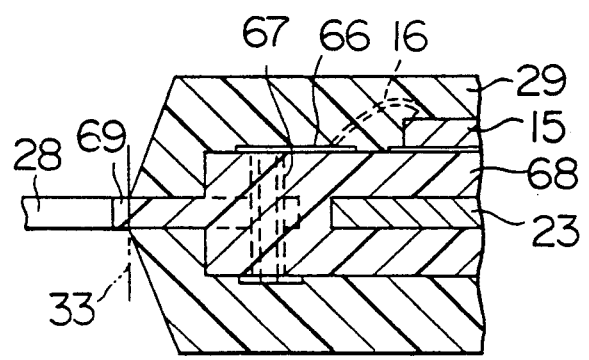
FIG. 31 is a sectional view of the semiconductor device employing the semiconductor integrated circuit mounting circuit board shown in FIG. 30.

By removing the first mask material 45 and the frame portion 21 (see FIG. 20 for example), a circuit board for mounting a semiconductor integrated circuit can be obtained. This circuit board comprises a bridge member 69 of an electrically insulating and heat-resisting resin having a thickness at least equal to that of the lead portions 28 and extending between the lead portions 28 over the region from the outer periphery of the insulating substrate 68 to at least the position (the boundary 33) corresponding to the outer surface of the mold resin (FIG. 31). In this embodiment, the insulating substrate 68 and the bridge member 69 are an integral member of the same material and are different only in thickness.

FIG. 31 illustrates a semiconductor device in which the semiconductor element 15 is mounted on the circuit board for mounting a semiconductor integrated circuit and connected to the conductive circuit 66 including the through holes 67 by the conductive wires 16 and in which these components together with the inner leads 31 are hermetically encapsulated within the mold resin by the transfer molding.

Figure 32:
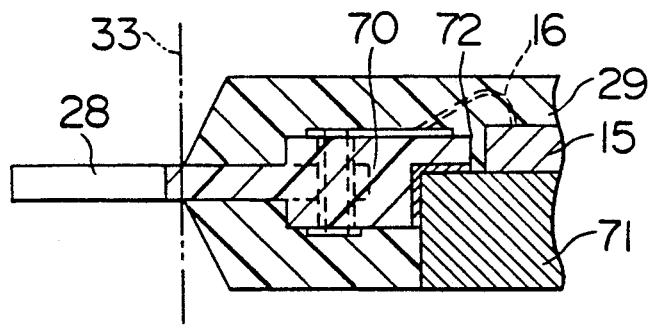
FIG. 32 is a sectional view of the semiconductor device having a heat sink.

In the semiconductor device illustrated in FIG. 32, a heat sink 71 is secured to an insulating substrate 70. In the illustrated embodiment, the island portion 23 of FIG. 31 is removed, an opening 72 is provided in the upper surface of the insulating substrate 70 to expose the upper surface of heat sink 71, and the semiconductor integrated circuit 15 is secured in the heat conducting relationship to the exposed surface of the heat sink 71. The lower portion of the heat sink 71 projects from the insulating substrate 70 and the bottom surface is exposed from the mold resin 29. In this embodiment, a heavy, large heat sink 71 can be easily and securely attached to the strong insulating substrate 70, thereby to improve the heat-dissipation of the semiconductor device.

Figure 33:
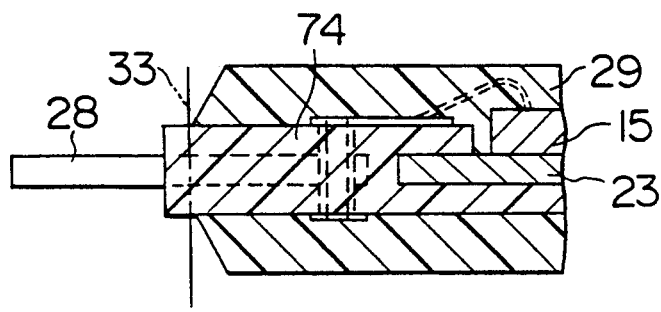
FIG. 33 is a sectional view of the semiconductor device in which the circuit board has an end face outside of the mold package.

In the semiconductor device illustrated in FIG. 33, the end faces of the side surfaces of the insulating substrate 74 are positioned slightly outside of the boundary 33, the thickness of the bridge member 69 shown in FIG. 31 is the same as the thickness of the insulating substrate 74, and the side surface of the substrate is exposed from the side surface of the mold resin 29 of the finished semiconductor device. This structure can be obtained by providing the second mask 47 of FIG. 26 only on the first mask 45 and achieving the cutting and separating operation by the laser machining of FIG. 29 at the position of the end face of the first mask 45.

Figure 34:
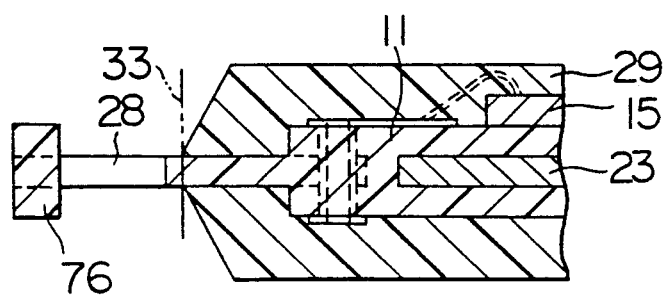
FIG. 34 is a sectional view of the semiconductor device having the protective member at the lead outer end portion.

The semiconductor device illustrated in FIG. 34 is manufactured by using a circuit board for mounting a semiconductor integrated circuit in which an electrically insulating protective member 76 secured to the outer end portion of the leads 28 for rigidly connecting them together. In order to manufacture the semiconductor device mounting circuit board of this structure, in the step of FIG. 26, the first mask material layer 45 is applied in the region outside of the position of the boundary 33 corresponding to at least the outer surface of the mold resin 29 on the lead portions 28 and except for the outer ends of the lead portions 28, by providing the second mask material layer 47 only on the first mask material layer 45, forming the electrically insulating resin substrate material layer 54 on the frame sheet including the second mask material layer 47, and removing the substrate material layer 54 on the outer lead portions 32 of the lead portions 28 together with the second mask material 47. Then, a frame-shaped protective member 76 made of the prepreg material extending continuously along the outer ends of the lead portions 28 for rigidly connecting the lead portions together is formed. The protective member 76 physically supports each lead 28 while maintaining the electrical independence, so that electrical tests of the conductor pattern and various connecting portions can be achieved on the semiconductor element mounting circuit board 77 before the semiconductor integrated circuit 15 is mounted or after the semiconductor integrated circuit 15 has been mounted and that the damages of the lead portions during shipping. The protective member 76 may be provided not only in the semiconductor device illustrated in FIG. 31, but also in the semiconductor devices illustrated in FIGS. 32 to 34.

As has been described, according to the present invention, the lead frame or the circuit board for mounting the semiconductor integrated circuit for use in encapsulating a semiconductor integrated circuit by transfer molding comprises electrically conductive lead portions connected to the frame portion and each partially encapsulated by a mold resin and divided by a boundary into an inner lead portion and an outer lead portion a bridge member extending between the lead portions at the poseidon corresponding to the outer surface of the mold resin and made of an electrically insulating and heat-resisting resin and having a thickness at least equal to the thickness of the lead portions, so that the lead portions are mechanically supported while being maintained electrically independent and the spaces between the lead portions can be closed by the bridge member when the mold dies are applied to the lead frame. Therefore, the tie-bar punching operation which has heretofore been necessary is not required any more, so that the lead pitch can be made extremely small.

What is claimed is:

1. A lead frame for use in encapsulating a semiconductor integrated circuit within a mold resin formed by a mold die, comprising:
    an electrically conductive frame portion having an opening;
    an electrically conductive island portion disposed within said opening of said frame portion for mounting the semiconductor integrated circuit thereon;
    a support pin portion connected between said island portion and said frame portion for supporting said island portion in place relative to said frame portion;
    a plurality of electrically conductive lead portions each having an outer end connected to said frame portion and an inner end extending from said frame portion toward said island portion and spaced apart from said island portion, said lead portions being spaced apart from each other to define a plurality of spaces therebetween, and each of said lead portions including an inner lead portion for encapsulation by the mold resin, an outer lead portion for projecting from an outer surface of the mold resin and a boundary between said inner lead portion and said outer lead portion; and
    a bridge member made of an electrically insulating and heat-resisting resin material extending between said lead portions at a position corresponding to said outer surface of said mold resin and having a thickness at least equal to the thickness of said lead portions, said bridge member extending outwardly from said boundary by a predetermined distance along said outer lead portions, and inwardly across said boundary by a predetermined distance along said inner lead portions,
    whereby said bridge member seals said spaces defined between said lead portions when the mold die is applied on said lead frame and reinforces said outer lead portions where said bridge member extends.

2. A lead frame as claimed in claim 1, wherein said bridge member extends from an outer periphery of said island portion beyond said boundary on said lead portions.

3. A lead frame as claimed in claim 1, wherein said bridge member has a raised portion disposed at an outer periphery of said island portion of said lead frame.

4. A lead frame as claimed in claim 1, wherein said bridge member comprises a portion extending to a back side of said island portion.

5. A lead frame for use in encapsulating a semiconductor integrated circuit within a mold resin formed by a mold die, comprising:
    an electrically conductive frame portion having an opening;
    a plurality of electrically conductive lead portions each having an outer end connected to said frame portion and an inner end inwardly extending from said frame portion, said lead portions being spaced apart from each other and defining an opening portion at an inner end face thereof, each of said lead portions including an inner lead portion for being encapsulated by the mold resin, an outer lead portion for being projecting from an outer surface of the mold resin and a boundary between said inner lead portion and said outer lead portion; and
    a bridge member made of an electrically insulating and heat-resisting resin material extending between said lead portions over an entire area inside a position corresponding to said outer surface of said mold resin and having a thickness at least equal to the thickness of said lead portion, said bridge member including a mounting portion for mounting the semiconductor integrated circuit thereon,
    whereby said bridge member seals said space defined between said lead portions when the mold die is applied on said lead frame.

6. A circuit board for mounting a semiconductor integrated circuit within a mold resin formed by a mold die, comprising:
    an electrically conductive frame portion having an opening;
    an electrically insulating substrate for mounting the semiconductor integrated circuit thereon, said substrate being disposed within said opening of said frame portion and having a circuit conductor for being electrically connected to the semiconductor integrated circuit;

a plurality of electrically conductive lead portions each having an outer end connected to said frame portion and an inner end extending from said frame portion into said substrate and electrically connected to said circuit conductor, said lead portions being spaced apart from each other to define a plurality of spaces therebetween, and spaced apart from said island portion, and each of said lead portions including an inner lead portion for encapsulation by the mold resin, an outer lead portion for projecting from an outer surface of the mold resin and a boundary between said inner lead portion and said outer lead portion; and a bridge member made of an electrically insulating and heat-resisting resin material extending between said lead portions at a position corresponding to said outer surface of said mold resin and having a thickness equal to the thickness of said lead portion, said bridge member extending outwardly from said boundary by a predetermined distance along said outer lead portions, and inwardly across said boundary by a predetermined distance along said inner lead portions, whereby said bridge member seals said spaces defined between said lead portions when the mold die is applied on said lead frame.

7. A semiconductor device, comprising:

an electrically conductive island for mounting a semiconductor integrated circuit thereon;

a semiconductor integrated circuit mounted thereon;

a plurality of electrically conductive leads each having an inner end spaced apart from said island and outwardly extending, said leads being spaced apart from each other to define spaces therebetween;

electrically conductive wires electrically connecting said semiconductor integrated circuit to said inner ends of said leads;

a mold resin encapsulating said island, said semiconductor integrated circuit, said leads and said conductive wires, said mold resin dividing each of said leads into an inner lead portion encapsulated within said mold resin and an outer lead portion outwardly projecting from an outer surface of said mold resin and defining a boundary therebetween; and a bridge member made of an electrically insulating and heat-resisting resin material extending between said leads at a position corresponding to said outer surface of said mold resin and having a thickness at least equal to the thickness of said leads, said bridge member extending outwardly from said boundary by a predetermined distance along said outer lead portions, thereby to reinforce said outer lead portions, and inwardly across said boundary by a predetermined distance along said inner lead portions.

8. A semiconductor device as claimed in claim 7, wherein said bridge member extends from an outer periphery of said island beyond said boundary on said lead.

9. A semiconductor device as claimed in claim 7, wherein said bridge member has a raised portion disposed at an outer periphery of said island.

10. A semiconductor device as claimed in claim 7, wherein said bridge member comprises a portion extending to the back side of said island.

11. A semiconductor device as claimed in claim 10, further comprising a heat dissipating plate on said bridge member at said portion extending to the back side of said island.

12. A semiconductor device, comprising:

a semiconductor integrated circuit;

a plurality of electrically conductive leads each having an inner end adjacent to said semiconductor integrated circuit and extending outwardly, said leads being spaced apart from each other to define spaces therebetween;

electrically conductive wires electrically connecting said semiconductor integrated circuit to said inner ends of said leads;

a mold resin encapsulating said semiconductor integrated circuit, said leads and said conductive wires, said mold resin dividing each of said leads into an inner lead portion encapsulated within said mold resin and an outer lead portion outwardly projecting from an outer surface of said mold resin and defining a boundary therebetween; and an electrically insulating bridge member extending between said leads at a position corresponding to said outer surface of said mold resin and having a thickness at least equal to the thickness of said leads, said bridge member extending outwardly from said boundary by a predetermined distance along said outer lead portions, and inwardly across said boundary by a predetermined distance along said inner lead portions.

13. A semiconductor device comprising:

an electrically insulating substrate for mounting a semiconductor integrated circuit thereon, said substrate having a circuit conductor for being electrically connected to the semiconductor integrated circuit;

a plurality of electrically conductive leads each having an outer and an inner end extending from said outer end into said substrate for secure connection therewith and electrically connected to said circuit conductor, electrically conductive wires electrically connecting said semiconductor integrated circuit to said inner ends of said leads;

a mold resin for encapsulating the semiconductor integrated circuit, said leads and said conductive wires, said mold resin dividing each of said leads into an inner lead portion encapsulated within said mold resin and an outer lead portion outwardly projecting from an outer surface of said mold resin and defining a boundary therebetween; and an electrically insulating bridge member extending between said leads at an area from the outer periphery of said substrate to a position corresponding to said outer surface of said mold resin, said bridge member including a mounting portion on which said semiconductor device is mounted and having a thickness at least equal to the thickness of said leads.

14. A semiconductor device as claimed in claim 13, further comprising a heat sink supported from said substrate in a thermally conductive relationship relative to said semiconductor integrated circuit and having at least one portion exposed from said mold resin.

15. A circuit board for mounting a semiconductor integrated circuit within a mold resin formed by a mold die, comprising:
- an electrically insulating substrate for mounting the semiconductor integrated circuit thereon and having a circuit conductor for being electrically connected to the semiconductor integrated circuit;
- a plurality of electrically conductive leads each having an inner end portions securely extending into said substrate and electrically connected to said circuit conductor and an outer end portions projecting from said substrate, each of said leads including an inner lead portion for being encapsulated by the mold resin, an outer lead portion for being projecting from an outer surface of the mold resin and a boundary between said inner lead portion and said outer lead portion;
- a bridge member made of an electrically insulating and heat-resisting resin material extending between said lead portions and from an outer periphery of said substrate to a position corresponding to said outer surface of said mold resin and having a thickness equal to the thickness of said lead portion; and
- an electrically insulating protective member secured to said outer end portions of said leads for rigidly connecting said outer end portions together;
- whereby said spaces between said lead portions are sealed by said bridge member when said mold die is applied to said lead portions.

16. A semiconductor device as claimed in claim 13 further comprising an electrically insulating protective member secured to said outer end portions of said leads for rigidly connecting said outer end portions together.

* * * * *